(12) United States Patent
Pandey et al.

(10) Patent No.: US 11,443,761 B2
(45) Date of Patent: Sep. 13, 2022

(54) REAL-TIME PITCH TRACKING BY DETECTION OF GLOTTAL EXCITATION EPOCHS IN SPEECH SIGNAL USING HILBERT ENVELOPE

(71) Applicant: Indian Institute of Technology Bombay, Mumbai (IN)

(72) Inventors: Prem Chand Pandey, Mumbai (IN); Hirak Dasgupta, Kolkata (IN); Nataraj Kathriki Shambulingappa, Davangere (IN)

(*) Notice: Subject to any disclaimer, the term of this patent is extended or adjusted under 35 U.S.C. 154(b) by 0 days.

(21) Appl. No.: 17/271,308

(22) PCT Filed: Aug. 3, 2019

(86) PCT No.: PCT/IN2019/050571
§ 371 (c)(1),
(2) Date: Feb. 25, 2021

(87) PCT Pub. No.: WO2020/044362
PCT Pub. Date: Mar. 5, 2020

(65) Prior Publication Data
US 2021/0201938 A1    Jul. 1, 2021

(30) Foreign Application Priority Data

Sep. 1, 2018   (IN) ............... 201821032901

(51) Int. Cl.
*G10L 25/90* (2013.01)
*G10L 25/21* (2013.01)

(52) U.S. Cl.
CPC ............. *G10L 25/90* (2013.01); *G10L 25/21* (2013.01); *G10L 2025/906* (2013.01)

(58) Field of Classification Search
CPC .... G10L 25/90; G10L 25/21; G10L 2025/906
See application file for complete search history.

(56) References Cited

U.S. PATENT DOCUMENTS 3,740,476 A    6/1973 Atal
4,486,900 A    12/1984 Cox et al.
(Continued)

FOREIGN PATENT DOCUMENTS

WO    2018/026329 A1    2/2018

OTHER PUBLICATIONS

Dash et al., "High Density Noise Removal by Using Cascading Algorithms" 2015 Fifth International Conference on Advanced Computing & Communication Technologies, 2015, pp. 96-101,IEEE (Year: 2015).*

(Continued)

*Primary Examiner* — Bhavesh M Mehta
*Assistant Examiner* — Edward Tracy, Jr.
(74) *Attorney, Agent, or Firm* — Hoffmann & Baron, LLP (57) ABSTRACT

A technique, suitable for real-time processing, is disclosed for pitch tracking by detection of glottal excitation epochs in speech signal. It uses Hilbert envelope to enhance saliency of the glottal excitation epochs and to reduce the ripples due to the vocal tract filter. The processing comprises the steps of dynamic range compression, calculation of the Hilbert envelope, and epoch marking. The Hilbert envelope is calculated using the output of a FIR filter based Hilbert transformer and the delay-compensated signal. The epoch marking uses a dynamic peak detector with fast rise and slow fall and nonlinear smoothing to further enhance the saliency of the epochs, followed by a differentiator or a Teager energy operator, and amplitude-duration thresholding. The technique is meant for use in speech codecs, voice conversion, speech and speaker recognition, diagnosis of voice disorders, speech training aids, and other applications involving pitch estimation.

16 Claims, 9 Drawing Sheets

(56) References Cited

U.S. PATENT DOCUMENTS

| | | | |
|---|---|---|---|
| 4,879,748 A | 11/1989 | Picone et al. | |
| 4,887,299 A | 12/1989 | Cummins et al. | |
| 5,054,085 A * | 10/1991 | Meisel | G10L 15/07 704/207 |
| 5,381,512 A | 1/1995 | Holton et al. | |
| 5,668,925 A * | 9/1997 | Rothweiler | G10L 19/06 704/E19.024 |
| 6,470,308 B1 | 10/2002 | Ma et al. | |
| 6,901,353 B1 * | 5/2005 | Huang | G06F 17/141 702/179 |
| 7,042,986 B1 * | 5/2006 | Lashley | H04M 1/6025 379/390.01 |
| 7,376,204 B1 * | 5/2008 | Music | H04L 25/0262 375/316 |
| 8,160,877 B1 | 4/2012 | Nucci et al. | |
| 8,725,498 B1 | 5/2014 | Sung et al. | |
| 9,263,052 B1 | 2/2016 | Talkin | |
| 10,453,479 B2 * | 10/2019 | Wilhelms-Tricarico | G10L 25/90 |
| 2010/0070283 A1 * | 3/2010 | Kato | G10L 21/02 704/E21.001 |
| 2013/0262096 A1 | 10/2013 | Wilhelms-Tricarico et al. | |
| 2015/0302845 A1 | 10/2015 | Nakano et al. | |
| 2017/0032803 A1 * | 2/2017 | Pandey | G10L 21/0232 |
| 2017/0347207 A1 * | 11/2017 | De Haan | H04R 25/43 |

OTHER PUBLICATIONS

Harrison et al., "Time-Compression Overlap Add: Description and Implementation" 2015 IEEE Pacific Rim Conference on Communications, Computers and Signal Processing (PACRIM) (pp. 64-69). IEEE. (Year: 2015).*

Ananthapadmanabha et al. "Epoch Extraction from Linear Prediction Residual for Identification of Closed Glottis Interval." In: IEEE Transactions on Acoustics, Speech, and Signal Processing, vol. ASSP-27, No. 4, Aug. 1979.

Murty, et al., "Epoch Extraction From Speech Signals," IEEE Transactions on Audio, Speech, and Language Processing, 16 (8), pp. 1602-1613, 2008.

* cited by examiner

REAL-TIME PITCH TRACKING BY DETECTION OF GLOTTAL EXCITATION EPOCHS IN SPEECH SIGNAL USING HILBERT ENVELOPE

CROSS-REFERENCE TO RELATED APPLICATIONS

This application is the U.S. National Phase Application of International Application No. PCT/IN2019/050571, filed on Aug. 3, 2019, and asserts priority to Application No. IN 201821032901 filed Sep. 1, 2018, the disclosures of which are hereby incorporated by reference in their entirety.

TECHNICAL FIELD

The present disclosure relates to processing of speech signals, and more particularly to real-time pitch tracking by detection of glottal excitation epochs in speech signal.

BACKGROUND

Voiced speech is the output of time-varying vocal tract filter excited by pulsatile airflow due to quasi-periodic vibration of the vocal folds in the larynx. The excitation is characterized by an impulsive excitation around the instants of glottal closure, known as the excitation epochs and the duration between two successive epochs is termed as the pitch period. The rate of vibration of the vocal folds is termed as the fundamental frequency of voicing, the pitch frequency, or the pitch. Pitch estimation is required for many speech processing applications such as speech codecs, voice conversion systems, speaker recognition, speech recognition of tonal languages, diagnosis of voice disorders, speech training aids, and other applications involving pitch tracking.

Speech codecs are used in speech communication devices for low bit rate signal transmission, by exploiting the redundancy in the speech signal, by coding the voicing, pitch, and vocal tract filter parameters. Syllabic-level pitch contour is needed for speech recognition in tonal languages. Pitch information has been reported to be useful in significantly reducing the computation time for speaker recognition. Pitch modification is an essential component of voice conversion, for converting the properties of the speech signal of the source speaker to those of the target speaker. Detection of abnormality in the distribution of the pitch periods and measurement of jitter is useful for diagnosis of voice disorders. Speech training aids providing a feedback of the pitch to the speaker during phonation can be used for improving the speech intelligibility, particularly for the tonal languages, and for improving the prosodic features. Most of these applications require real-time pitch tracking.

A number of pitch estimation methods have been reported for different applications. These methods can be broadly grouped into window-based and event-based methods. The window-based methods segment the signal using an analysis window, treating the signal as stationary for the duration of the analysis window. The window-based methods may use time-domain, frequency-domain, or time-frequency domain analysis. The time-domain analysis uses the periodicity property of the voiced speech signal and the frequency-domain analysis uses the harmonic structure in the spectrum of the voiced speech signal. A combination of these properties is used in the time-frequency domain analysis. The window-based methods cannot track fast changes in the pitch and may have pitch doubling and pitch halving errors.

The event-based methods locate points associated with a significant epoch in each cycle of the glottal excitation. These methods generally require the presence of excitation component at the fundamental frequency of the speech signal and hence are not suited for high-pass filtered speech.

In a method proposed by Atal (B. S. Atal, "Speech signal pitch detector using prediction error data," U.S. Pat. No. 3,740,476, 1973), peaks of the glottal excitation are detected by amplitude thresholding of the linear prediction (LP) residual. Several variants of this technique have been used in speech codecs. Cox et al. (R. V. Cox and R. E. Crochiere, "Real-time pitch detection by stream processing," U.S. Pat. No. 4,486,900, 1984) proposed real-time pitch estimation using autocorrelation over a 20-ms window and a sequential peak peaking to locate the autocorrelation peaks in the pitch range of the signal.

In a method proposed by Picone et al. (J. Picone and D. Prezas, "Parallel processing pitch detector," U.S. Pat. No. 4,879,748, 1989), four pitch periods are estimated by applying peak-picking on the LP residual, negated LP residual, speech signal, and negated speech signal, and a voting for final estimate of the pitch period Ma et al. (C. X. Ma and L. F. Willems, "Human speech processing apparatus for detecting instants of glottal closure," U.S. Pat. No. 6,470,308 B1, 2002) proposed detection of glottal epochs by amplitude thresholding of the low-pass filtered and rectified signal, with the low-pass filter realized as a moving average filter with a trapezoidal window of length less than the lowest pitch period and the threshold obtained as the output of another moving average filter with a larger window length.

Nucci et al. (A. Nucci and R. Keralapura, "Hierarchical real-time speaker recognition for biometric VoIP verification and targeting," U.S. Pat. No. 8,160,877 B1, 2012) proposed pitch estimation using the largest non-DC peak in the power spectrum of amplitude envelope obtained using discrete energy separation algorithm. Sung et al. (Y. Sung, M. Wang, and X. Lei, "Mobile speech recognition with explicit tone features," U.S. Pat. No. 8,725,498 B1, 2014) proposed three embodiments for pitch tracking using frequency-domain analysis, autocorrelation analysis, and band-pass filtering with the passband selected for the pitch range.

In a method proposed by Talkin (D. Talkin, "Simultaneous estimation of fundamental frequency, voicing state, and glottal closure instant," U.S. Pat. No. 9,263,052 B1, 2016), initial candidate epochs are detected using the peak and the pulse shape of the normalized and polarity-corrected LP residual, initial estimate of the fundamental frequency is obtained by normalized cross-correlation applied on a linear combination of the signal and its LP residual, and the voicing probability is based on the RMS value of the signal. These initial estimates are refined by minimizing a cost function using dynamic programming.

Kacic (Z. Kacic, "Pitch period and voiced/unvoiced marking method and apparatus," PCT International Publication No. WO 2018/026329 A1, 2018) proposed method and apparatus for obtaining the pitch period using band-pass filtering of speech signal with the center of the passband selected using a coarse pitch estimated from the short-time autocorrelation of the signal. The pitch marks are located at the signal peaks nearest to the positive zero crossings of the band-pass filtered signal and the pitch period is estimated as the interval between two pitch marks.

In an epoch detection method by Murty et al. (K. S. R. Murty and B. Yegnanarayana, "Epoch extraction from speech signals," IEEE Transactions on Audio, Speech, and Language Processing, 16 (8), pp. 1602-1613, 2008), the effect of the vocal tract response is reduced by passing the pre-emphasized signal through two marginally stable cascaded zero frequency resonators (ZFR). The positive zero-crossings of the sinusoid-like signal generated by repeated mean-subtraction of the output of the resonator represent the glottal closure instants (GCIs). In a method by Drugman et al. (T. Drugman and T. Dutoit, "Glottal closure and opening instant detection from speech signals," Proceedings of Interspeech 2009, pp. 2891-2894), the epoch containing intervals are marked from the local-minima to the subsequent positive zero-crossings on a running mean-based speech signal and the highest peaks of the LP residual in these intervals are marked as the epochs. These techniques require the presence of the fundamental and hence cannot be used for epoch detection of high-pass filtered speech.

Patil et al. (H. A. Patil and S. Viswanath, "Effectiveness of Teager energy operator for epoch detection from speech signals," International Journal of Speech Technology, 14 (4), pp. 321-337, 2011) and Shikhah et al. (N. Shikhah and M. Deriche, "A novel pitch estimation technique using the Teager energy function," Proceedings of IEEE ISSPA 1999, pp. 135-138) used Teager energy operator on a low-pass filtered speech for GCI detection. This method is not suitable for epoch detection of high-pass filtered speech.

In a method proposed by Prathosh et al. (A. P. Prathosh, T. V. Ananthapadmanabha, and A. G. Ramakrishnan, "Epoch extraction based on integrated linear prediction residual using plosion index," IEEE Transactions on Audio, Speech, and Language Processing, 21 (12), pp. 2471-2480, 2013), an integrated LP residual (ILPR) is calculated by inverse filtering the signal using LP coefficients estimated from short-time, Hamming windowed, and pre-emphasized signal, to reduce the bipolar swing of the LP residual around epochs due to the phase angle of formants. Modified short-time crest factor, termed as the dynamic plosion index, is used on the half-wave rectified ILPR to estimate instants of significant excitation. The high peak-valley swing of the dynamic plosion index, which is computed for a fixed window, marks the instant of glottal closure. Prathosh et al. (A. P. Prathosh, P. Sujith, A. G. Ramakrishnan, and P. K. Ghosh, "Cumulative impulse strength for epoch extraction," IEEE Signal Processing Letters, 23 (4) pp. 424-428, 2016) proposed a recursive algorithm using a temporal measure derived from the ILPR to detect the glottal epochs.

In a method by Gonzalez et al. (S. Gonzalez and M. Brooke, "PEFAC—a pitch estimation algorithm robust to high levels of noise," IEEE Transactions on Audio, Speech, and Language Processing, 22 (2), pp. 518-528, 2014), the smoothed short-time spectrum is normalized by long-time average spectrum in the log-frequency domain, for robustness against noise while retaining the harmonic structure. The harmonic structure is enhanced by applying a smooth comb filter and the most probable pitch candidate is selected for each frame. The fundamental frequency is estimated by applying a temporal continuity measure on the initially estimated pitch values.

Vikram et al. (C. M. Vikram and S. R. M. Prasanna, "Epoch extraction from telephone quality speech using single pole filter," IEEE/ACM Transactions on Audio, Speech, and Language Processing, 25 (3), pp. 624-636, 2017) proposed detection of the glottal excitation epochs in telephony speech using an infinite impulse response (IIR) filter bank approach, assuming that filtering at half the sampling frequency provides a good separation between career and amplitude modulated components of the signal. A narrowband filter with resonance at half the sampling frequency is used to enhance instants of glottal excitation. The average of the envelopes of all filters has a high peak-to-valley swing around the instants of glottal closure. The salient points are determined initially as lying between the successive positive zero-crossings of the smoothed average envelope and then located within these intervals by marking the highest peak-to-valley swing in the output of the narrowband filter.

The available pitch estimation methods have varying computational complexities and algorithmic delays and are generally not well suited for real-time pitch tracking with high accuracy and good dynamic response, particularly for high-pass filtered speech.

SUMMARY

A method and a system are disclosed for real-time pitch tracking by detection of glottal excitation epochs in speech signal, using Hilbert envelope to enhance saliency of the glottal excitation epochs and to reduce the ripples due to the vocal tract filter.

In an implementation of the present disclosure, a method for real-time pitch tracking is disclosed. The method comprises applying a dynamic range compression on the speech signal to obtain a dynamic range compressed signal, calculating a Hilbert envelope of the dynamic range compressed signal, and obtaining epochs and pitch periods by processing the Hilbert envelope by applying dynamic peak tracking, saliency enhancement, and amplitude-duration thresholding.

In another implementation, a system is disclosed. The system comprises a dynamic range compression module configured to perform dynamic range compression of the speech signal to obtain a dynamic range compressed signal, a Hilbert envelope calculation module configured to calculate the Hilbert envelope of the dynamic range compressed signal, and an epoch marking and pitch detection module configured to mark epochs and to output pitch periods by processing the Hilbert envelope by applying dynamic peak tracking, saliency enhancement, and amplitude-duration thresholding.

BRIEF DESCRIPTION OF THE DRAWINGS

The detailed description of the invention is described with reference to the accompanying figures.

DETAILED DESCRIPTION OF THE INVENTION

A method and system are disclosed for pitch tracking by detection of glottal excitation epochs in speech signal, wherein the method permits real-time processing and is robust against high-pass filtering. Further, the method is based on calculating the Hilbert envelope of the speech signal to enhance the excitation epochs and to suppress the ripples related to the vocal tract response. A dynamic range compression can be applied before the calculation of the Hilbert envelope, and an epoch marker may be used to detect the high-saliency points in the Hilbert envelope. The impulses corresponding to the detected epochs can then be used for pitch period estimation.

The voiced speech signal can be assumed as the convolution of the impulse response of the time-varying vocal tract and glottal filter with the quasi-periodic impulse train due to glottal vibration. The speech signal s(n) during voiced regions can be approximated by the short-time harmonic model as $$s(n) = \sum_{k=1,N} b_k \cos(k\omega_0 n + \theta_k) \quad (1)$$

where $b_k$ and $\theta_k$ represent the combined effect of the vocal tract and glottal filters and $\omega_0$ is the fundamental frequency. The Hilbert envelope of the speech signal s(n) is the squared magnitude of the complex analytic signal $s_a(n)$, which is given as $$s_a(n) = s(n) + js_h(n) \quad (2)$$

where $s_h$ (n) is the Hilbert transform (see A. V. Oppenheim, R. W. Schafer, and J. R. Buck, Discrete-Time Signal Processing, Upper Saddle River, N.J.: Prentice-Hall, 1999) of the speech signal s(n). The Hilbert transform can be obtained by a π/2-phase shifter, also known as the Hilbert transformer, with the frequency and impulse responses given as $$H(\omega) = \begin{cases} -j, & 0 < \omega < \pi \\ 0, & \omega = 0, \pi \\ j, & -\pi < \omega < 0 \end{cases} \quad (3)$$

$$h(n) = \begin{cases} \sin^2(n\pi/2)/(n\pi/2), & n \neq 0 \\ 0, & n = 0 \end{cases} \quad (4)$$

The Hilbert envelope $e_h$ (n) may be given as $$e_h(n) = s^2(n) + s_h^2(n) \quad (5)$$

The Hilbert transform $s_h$ (n) for the speech signal s(n) in Equation 1, can be given as $$s_h(n) = \sum_{k=1,N} b_k \sin(k\omega_0 n + \theta_k) \quad (6)$$

The Hilbert envelope $e_h$ (n) can be expressed as $$e_h(n) = \sum_{q=1}^{N} b_q^2 + 2\sum_{q=1}^{N-1} b_q b_{q+1} \cos(\omega_0 n + \theta_{q+1} - \theta_q) + \quad (7)$$

$$2\sum_{q=1}^{N-2} b_q b_{q+2} \cos(2\omega_0 n + \theta_{q+2} - \theta_q) +$$

$$\cdots + 2b_1 b_N \cos\{(N-1)\omega_0 n + \theta_N - \theta_1\}$$

The Hilbert envelope $e_h$ (n) consists of an offset and sum of harmonics of $\omega_0$, with several harmonics in s(n) contributing to the fundamental and enhancing the instants of significant excitation.

Figure 1:
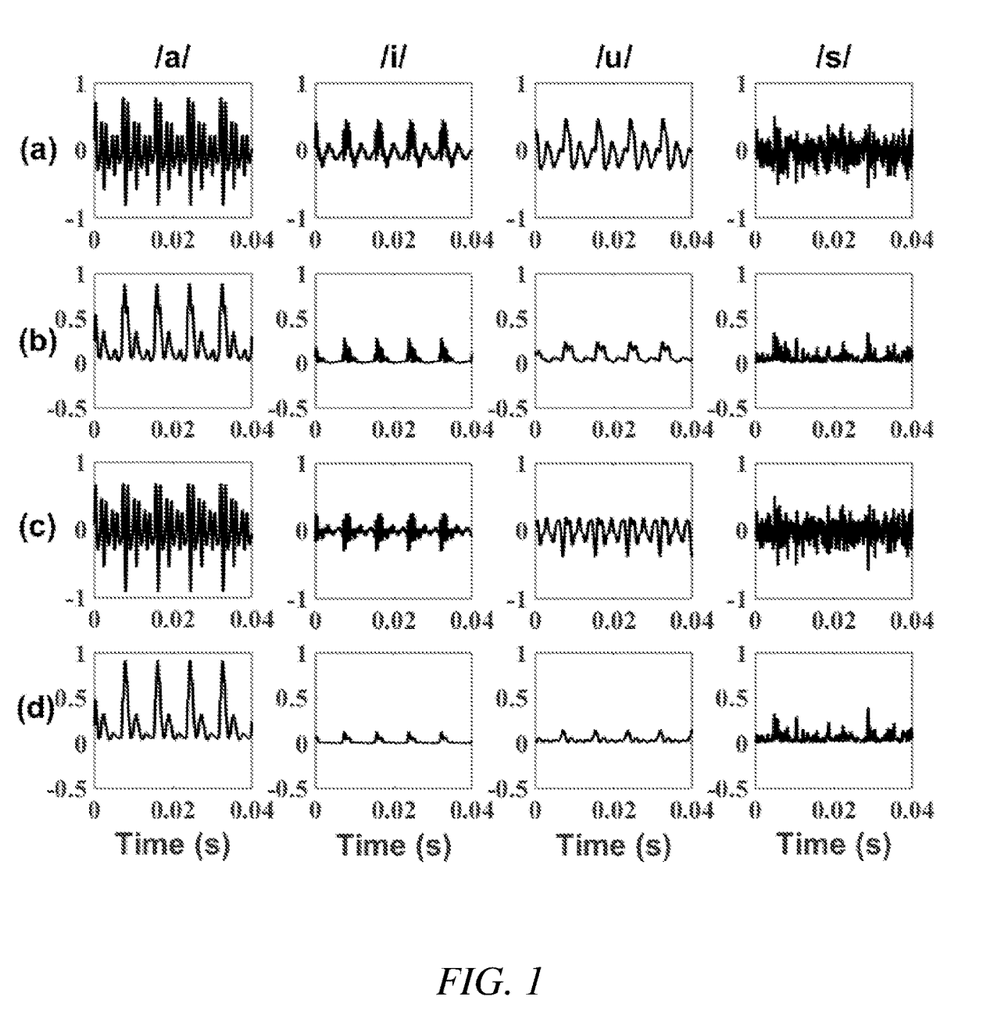
FIG. 1 illustrates examples of the Hilbert envelope, with waveforms of three vowels and a fricative.

FIG. 1 illustrates examples of the Hilbert envelope of speech waveforms. Panel (a) shows the waveforms of three synthesized vowels (/a/, /i/, /u/ with a pitch of 120 Hz) and an unvoiced fricative (/s/). Panel (b) shows the Hilbert envelopes of the waveforms in panel (a). It can be observed that the Hilbert envelope enhances the saliency of the epochs of periodic excitation in case of vowels and no such saliency is visible in the case of the unvoiced fricative. Panel (c) shows high-pass filtered (300 Hz cutoff) waveforms corresponding to the waveforms in panel (a) and panel (d) shows the Hilbert envelopes of the waveforms in panel (c). It is observed that the Hilbert envelope enhances the saliency of the excitation epochs even after high-pass filtering of the input signal. These examples show that Hilbert envelope can be used for detection of the glottal excitation epochs in the voiced speech segments and thus can be used for pitch tracking even for high-pass filtered speech signal.

Figure 2:
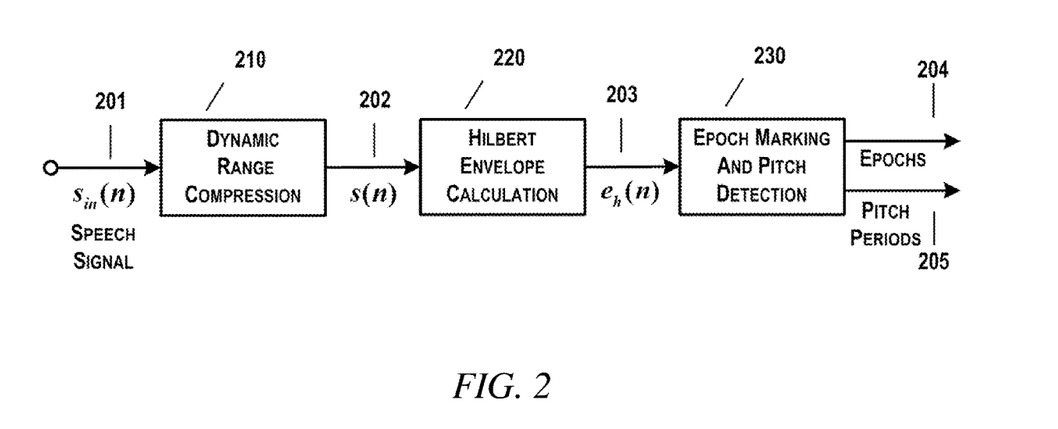
FIG. 2 is a schematic illustration of the pitch tracking by detection of glottal excitation epochs in speech signal using Hilbert envelope, in accordance with an embodiment of the present disclosure.

FIG. 2 illustrates a block diagram of the pitch tracking by detection of glottal excitation epochs in speech signal using Hilbert envelope in accordance with an embodiment of the present disclosure. The pitch tracking technique comprises a module for dynamic range compression (210), a module for Hilbert envelope calculation (220), and a module for epoch marking and pitch detection (230). The speech signal (201) is applied to the dynamic range compression module 210 to obtain a dynamic range compressed signal (202). The dynamic range compressed signal 202 is applied to the Hilbert envelope calculation module 220 to obtain a Hilbert envelope (203). The Hilbert envelope 203 is applied to the epoch marking and pitch detection module 230, which outputs epochs (204) and pitch periods (205).

The processing modules of the embodiment illustrated in FIG. 2 are devised for real-time processing, with single-pass operations and total algorithmic delay much below 125 ms, which is considered as acceptable during face-to-face communication to avoid audio-visual de-synchrony. In the subsequent detailed description of the processing modules, values of the processing parameters are given for the sampling frequency $f_s$ of 10 kHz and these values need to be appropriately modified for other sampling frequencies.

Figure 3:
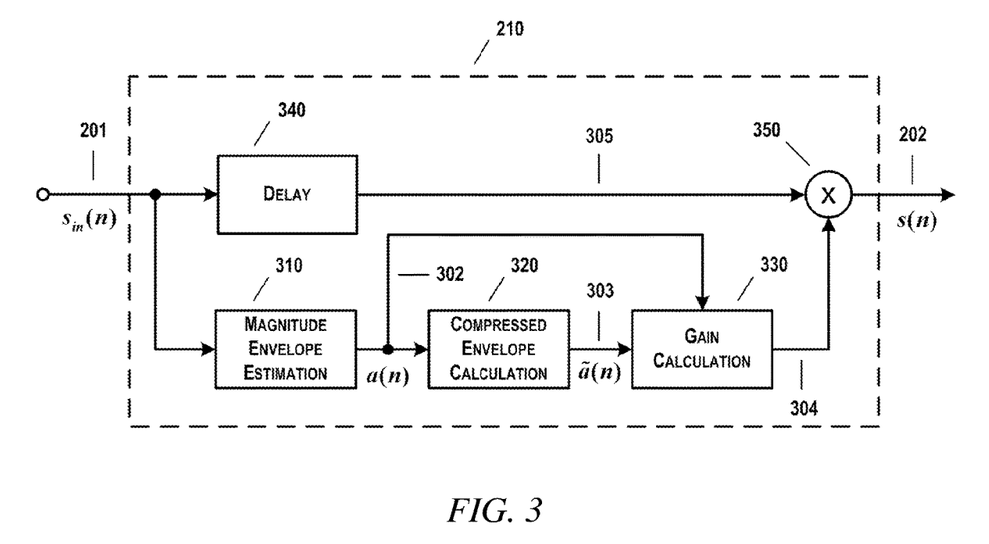
FIG. 3 is a schematic illustration of dynamic range compression module using feed-forward compression of the envelope of the speech signal, in accordance with an aspect of the present disclosure.

The dynamic range compression serves as a pre-processing step to the Hilbert envelope calculation in order to reduce the possibility of misdetection of the epochs during low-energy speech segments. Dynamic range compression can be implemented in several ways. FIG. 3 illustrates a schematic block diagram of dynamic range compression realized by applying feed-forward compression, in accordance with an exemplary embodiment of the present disclosure. The 7 is based on the A-law (see U. Zölzer, Digital Audio Signal Processing, West Sussex, UK: Wiley, 2008) on the envelope of the speech signal. The processing for dynamic range compression module 210 may comprise a magnitude envelope estimation module (310), a compressed envelope calculation module (320), a gain calculation module (330), a first delay module (340), and a multiplier module (350). The speech signal 201 is applied to the magnitude envelope estimation module 310, wherein the magnitude envelope estimation module 310 calculates a short-time average magnitude of the speech signal to obtain a magnitude envelope (302). The magnitude envelope 302 is applied to the compressed envelope calculation module 320 to obtain a compressed envelope (303). The magnitude envelope 302 and the compressed envelope 303 are applied to the gain calculator module 330 to obtain a gain (304). The speech signal 201 is also applied to the first delay module 340, wherein the delay module delays the input signal so as to compensate for the delay in the processing path during the gain calculation, to obtain a delayed speech signal (305). The delayed speech signal 305 and the gain 304 are applied to the multiplier module 350 to obtain the dynamic range compressed signal 202.

In the dynamic range compression module 210 as illustrated in FIG. 3, the magnitude envelope estimation module calculates the magnitude envelope a(n) as the short-time average magnitude of the speech signal $s_{in}(n)$, using the following recursive equation:

$$a(n)=a(n-1)+[|s_{in}(n)|-|s_{in}(n-L)|]/L \quad (8)$$

The value L selected corresponds to a 25-ms window, i.e. $L=25\times10^{-3}f_s$. For the input signal range of [−1, +1], the A-law compressed envelope is given as $$\tilde{a}(n) = \begin{cases} Aa(n)/(1+\ln A), & 0 \le a(n) \le 1/A \\ [1+\ln\{Aa(n)\}]/(1+\ln A), & 1/A < a(n) \le 1 \end{cases} \quad (9)$$

A time-varying gain g(n) is calculated from the magnitude envelope a(n) and the compressed envelope ã(n) as $$g(n)=\tilde{a}(n)/a(n) \quad (10)$$

The speech signal $s_{in}(n)$ is delayed with a delay equal to the delay introduced by the magnitude envelope estimation module and is multiplied with the time-varying gain g(n) to obtain the dynamic range compressed signal s(n) as $$s(n)=g(n)s_{in}(n-(L-1)/2) \quad (11)$$

Figure 4:
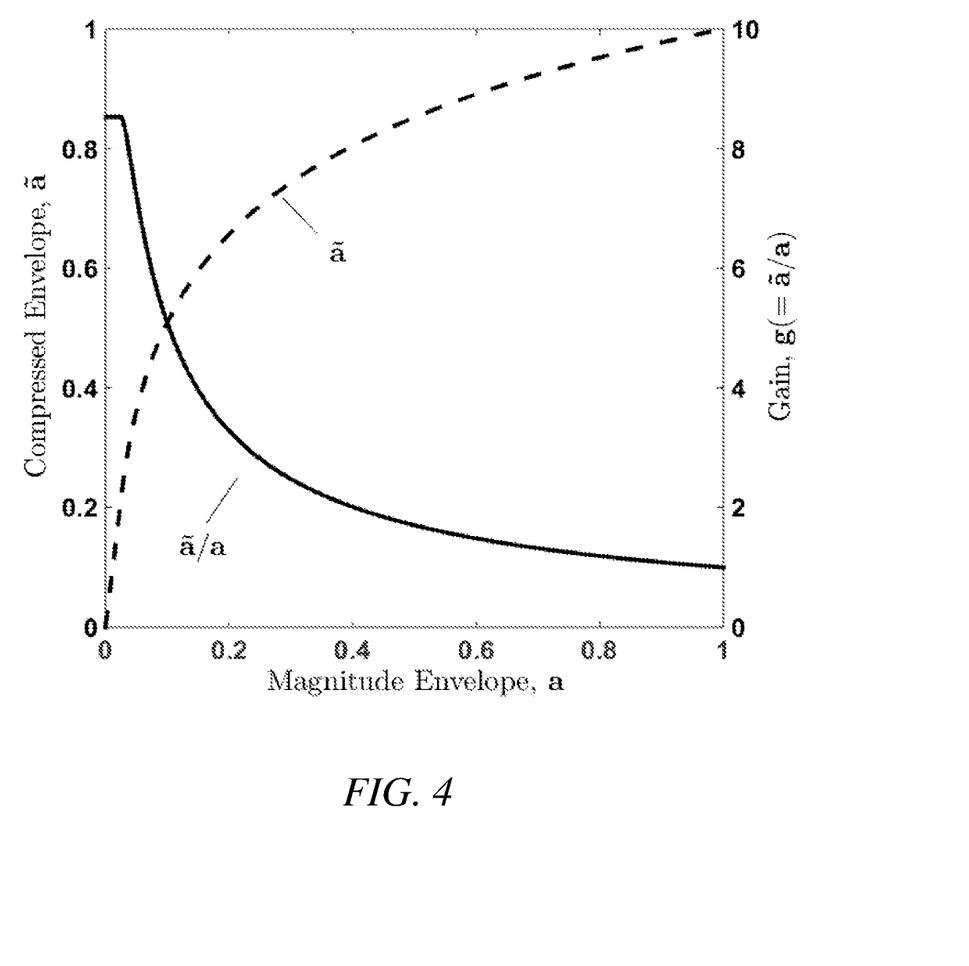
FIG. 4 illustrates the relation of the envelope of the speech signal with the compressed envelope and also with the gain used for the compression.

The value of A in Equation 9 is set as 40 to provide compression without excessive increase of noise during the silences and it results in the highest gain of approximately 19 dB. FIG. 4 illustrates the relation of the magnitude envelope a with the compressed envelope ã and also with the gain g used for the compression. It may be noted that the compression based on the A law can be replaced by a compression based on other compression functions like the μ law or power law.

Figure 5:
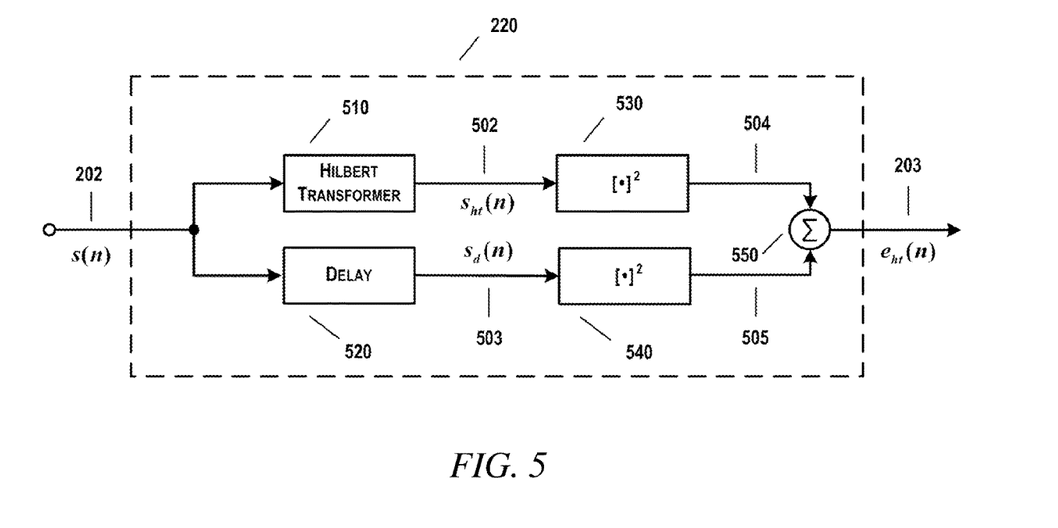
FIG. 5 is a schematic illustration of the Hilbert envelope calculation module, in accordance with an aspect of the present disclosure.

FIG. 5 illustrates an implementation of the Hilbert envelope calculation module 220, in accordance with an exemplary embodiment of the present disclosure. The Hilbert envelope calculation module 220 comprises a Hilbert transformer module (510), a second delay module (520), a first squaring module (530), a second squaring module (540), and a first adder module (550). The dynamic range compressed signal (202) is applied to the Hilbert transformer module (510) to obtain a Hilbert transformed signal (502). The dynamic range compressed signal (202) is also applied to the second delay module (520) to obtain a delayed dynamic range compressed signal 503. The delay introduced by the second delay module 520 is equal to the delay introduced by the Hilbert transformer module 510. The Hilbert transformed signal 502 ($s_{ht}(n)$) is applied to the first squaring module 530 to obtain a squared Hilbert transformed signal (504). The delayed dynamic range compressed signal 503 ($s_d(n)$) is applied to the second squaring module 540 to obtain a squared delayed dynamic range compressed signal (505). The first adder module 550 adds the squared Hilbert transformed signal 504 and the squared delayed dynamic range compressed signal 505 to obtain the Hilbert envelope 203 ($e_{ht}(n)$).

The Hilbert transformer 510, used for the Hilbert envelope calculation as shown in FIG. 5, may be realized using an FIR filter with impulse response $h_t(n)$ obtained by applying a Hamming window of length M on the non-causal impulse response h(n) of the Hilbert transformer as given in Equation 4 and (M−1)/2-sample shift. The Hilbert envelope $e_{ht}(n)$ is calculated from the output of the Hilbert transformer $s_{ht}(n)$ and the delayed dynamic range compressed signal $s_d(n)$ using the following equations:

$$s_{ht}(n)=s(n)*h_t(n) \quad (12)$$

$$s_d(n)=s(n-(M-1)/2) \quad (13)$$

$$e_{ht}(n)=s_{ht}^2(n)+s_d^2(n) \quad (14)$$

In order to suppress the glottal and vocal tract filter responses without excessive smearing of the representation of the glottal excitation in the envelope, M is empirically selected to correspond to 15 ms, i.e. $M=15\times10^{-3}f_s$.

Figure 6:
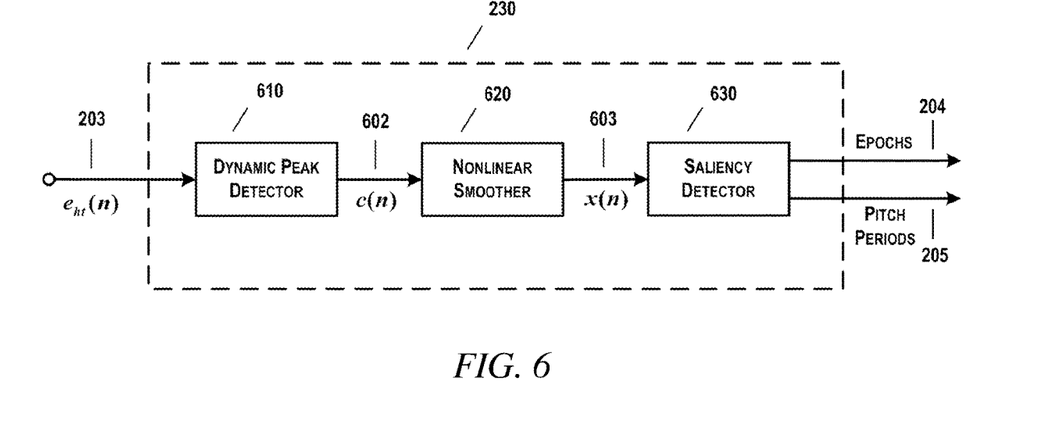
FIG. 6 is a schematic illustration of the epoch marking and pitch detection module, in accordance with an aspect of the present disclosure.

The epoch marking and pitch detection module 230 in the block diagram of FIG. 2 may be realized as a dynamic peak detector followed by nonlinear smoother to further reduce the residual ripples in the output of the Hilbert envelope without reducing the saliency of the epochs, and a saliency detector to mark the epochs as impulses and to output the pitch periods. FIG. 6 illustrates an embodiment of the epoch marking and pitch detection module 230, in accordance with an aspect of the present disclosure. The epoch marking and pitch detection module 230 comprises a dynamic peak detector module (610), a nonlinear smoother module (620), and a saliency detector module (630). The Hilbert envelope 203 is applied to the dynamic peak detector module 610 to obtain a peak envelope (602). The peak envelope 602 is applied to the nonlinear smoother module 620 to obtain a smoothed peak envelope (603). The smoothed peak envelope 603 is applied to the saliency detector module 630 to obtain the glottal epochs 204 and the pitch periods 205.

The dynamic peak detector module 610 of FIG. 6 is realized for updating peak c(n) and valley d(n) of the Hilbert envelope $e_{ht}(n)$, using the following recursive equations:

$$c(n) = \begin{cases} \mu c(n-1)+(1-\mu)e_{ht}(n), & \text{if } e_{ht}(n) \ge c(n-1) \\ vc(n-1)+(1-v)d(n-1), & \text{otherwise} \end{cases} \quad (15)$$

$$d(n) = \begin{cases} \mu d(n-1)+(1-\mu)e_{ht}(n), & \text{if } e_{ht}(n) \ge d(n-1) \\ vd(n-1)+(1-v)c(n-1), & \text{otherwise} \end{cases} \quad (16)$$

The valley d(n) tracks the time-varying offset in the Hilbert envelope, where the constants μ and v, selected to be in the range [0,1], control the rise and fall rates. A fast rise (small μ) and slow fall (large v) help in suppressing the ripples while retaining saliency of the epochs. In an exemplary embodiment, these values are selected as μ=0.1 and v=0.9954 for 90% rise in one sample and 60% fall in 100 samples.

Figure 7:
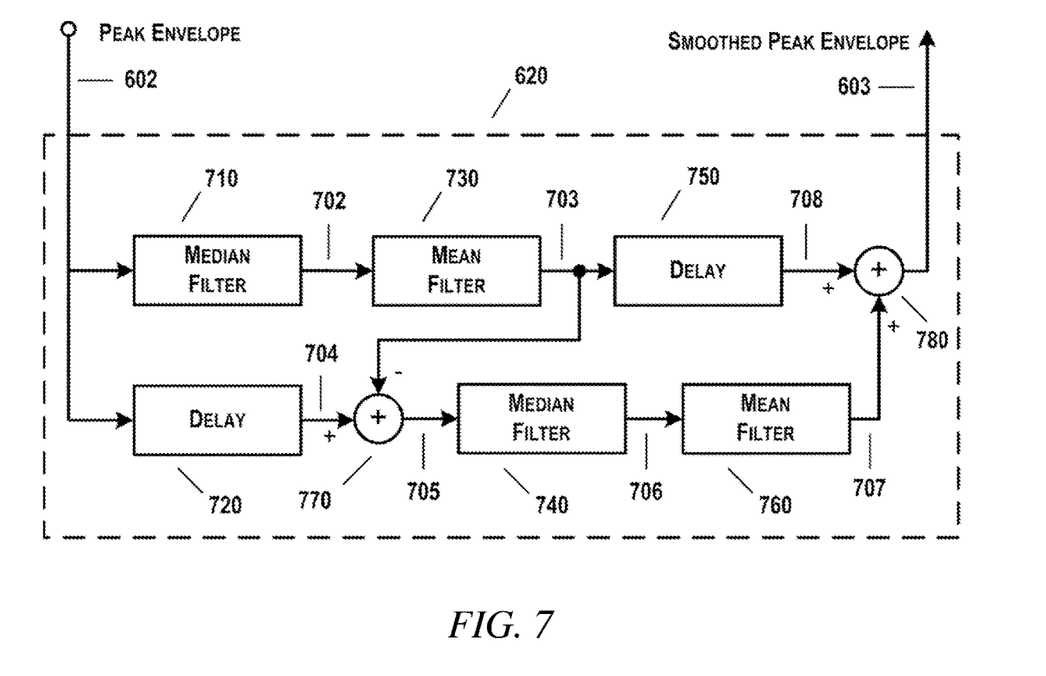
FIG. 7 is a schematic illustration of the nonlinear smoother used as part of the epoch marking and pitch detection module, in accordance with an aspect of the present disclosure.

FIG. 7 illustrates an implementation of the nonlinear smoother module 620 of FIG. 6, using a two-stage median-mean filter, in accordance with a preferred embodiment of the present disclosure. The nonlinear smoother module 620 comprises a first median filter module (710), a first mean filter module (730), a third delay module (720), a second adder module (770), a second median filter module (740), a second mean filter module (760), a fourth delay module (750), and a third adder module (780). The peak envelope 602 is applied to the first median filter module 710 to obtain a first-stage median filtered peak envelope (702), which is applied to the first mean filter module 730 to obtain a first-stage median-mean filtered peak envelope (703). The peak envelope 602 is also applied to the third delay module 720 to obtain a delayed peak envelope (704). The delay introduced by the third delay module 720 is equal to the delay introduced by the combination of the first mean filter module 730 and the first median filter module 710. The second adder module 770 subtracts the first-stage median-mean filtered peak envelope 703 from the delayed peak envelope 704 to obtain a peak envelope residual (705), which is applied to the second median filter module 740 to obtain a median filtered residual (706). The median filtered residual 706 is applied to the second mean filter module 760 to obtain a median-mean filtered residual (707). The first-stage median-mean filtered peak envelope 703 is applied to the fourth delay module 750 to obtain a delayed first-stage median-mean filtered peak envelope (708). The delay introduced by the fourth delay module 750 is equal to the delay introduced by the combination of the second mean filter module 760 and the second median filter module 740. The third adder module 780 adds the delayed first-stage median-mean filtered peak envelope 708 and the median-mean filtered residual 707 to obtain the smoothed peak envelope 603.

The nonlinear smoother 620 of FIG. 7 is used to suppress the residual ripples in the peak detector output. The first median-mean filter reduces the small ripples without smearing the large transitions and the second median-mean filter helps in restoring the peak-to-valley contrast. The length of the filters and the delays may be chosen to optimally suppress the residual vocal-tract filter related ripples in the smoothed peak envelope output of the peak detector without smearing the excitation saliency. The preferred embodiment uses 11-point median and 3-point mean filters.

Figure 8:
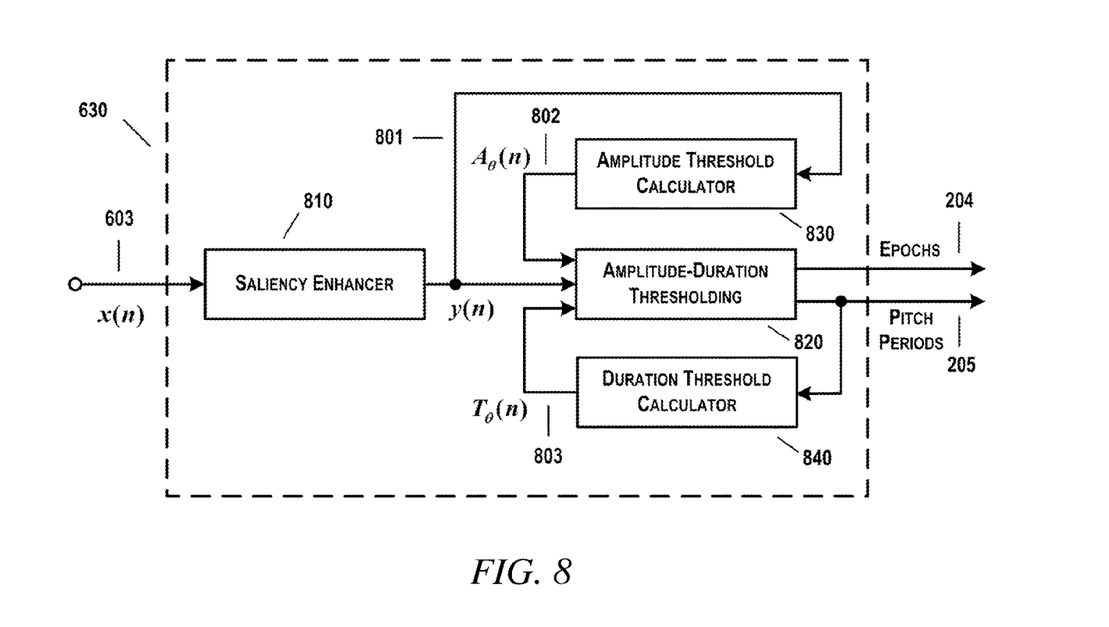
FIG. 8 is a schematic illustration of the saliency detector used as part of the epoch marking and pitch detection module, in accordance with an aspect of the present disclosure.

Referring to the saliency detector module 630 of FIG. 6, the smoothed peak envelope 603 is used for locating the salient points related to the instants of glottal excitation. In one embodiment of the saliency detector module, the epochs are detected, and the inter-epoch intervals are output as the pitch periods using a saliency enhancer and amplitude-duration thresholding. A schematic block diagram of the saliency detector, in accordance with an aspect of the present disclosure, is shown in FIG. 8. The saliency detector module (630) comprises a saliency enhancer module (810), an amplitude-duration thresholding module (820), an amplitude threshold calculator (830), and a duration threshold calculator (840). The smoothed peak envelope (603) x(n) is applied to the saliency enhancer module (810) to obtain a saliency-enhanced peak envelope (801). The saliency enhanced peak envelope (801) (y(n)) along with an amplitude threshold (802) and a duration threshold (803) is applied to the amplitude-duration thresholding module (820) to obtain the epochs (204) and the pitch periods (205). The saliency-enhanced peak envelope (801) is applied to an amplitude threshold calculator (830) to obtain the amplitude threshold (802)($A_\theta(n)$). The pitch periods (205) are applied to the duration threshold calculator (840) to obtain the duration threshold (803) ($T_\theta(n)$).

In the saliency enhancer module of the saliency detector module 630 as shown in FIG. 8, differentiation may be applied on the smoothed peak envelope x(n) to emphasize the points with high-rate of change to obtain the saliency-enhanced peak envelope y(n). The differentiation may be carried out using the following 5-point difference equation:

$$y(n)=[-x(n)+8x(n-1)-8x(n-3)+x(n-4)]/12 \tag{17}$$

It may be noted that the differentiator may be replaced by other operations to emphasize the points with high-rate of change. One such operation is a real-time version of the Teager energy operator given as $$y(n)=x^2(n-1)-x(n)x(n-2) \tag{18}$$

In the saliency detector module (630) as shown in FIG. 8, the salient points corresponding to the excitation impulses are detected by applying amplitude-duration thresholding on the saliency-enhanced peak envelope y(n), using the amplitude threshold $A_\theta(n)$ and the duration threshold $T_\theta(n)$. A point is marked as an epoch if the saliency-enhanced peak envelope y(n) exceeds the amplitude threshold $A_\theta(n)$ and the time interval between this point and the last detected epoch exceeds $T_\theta(n)$. At each epoch marking, an impulse is output as the epoch 204 and the inter-epoch interval is output as the pitch period 205. The amplitude threshold $A_\theta(n)$ is calculated as the short-time average magnitude of the saliency-enhanced peak envelope y(n) as $$A_\theta(n)=A_\theta(n-1)+[|y(n)|-|y(n-P)|]/P \tag{19}$$

where P corresponds to a 10-ms window, i.e. $P=10\times10^{-3}f_s$. The duration threshold $T_\theta(n)$ is calculated from the pitch periods, as half of the mean of the preceding ten pitch periods which are lying within a set range, which may be 2-15 ms. A lower limit, which may be 2 ms. is applied on the duration threshold $T_\theta(n)$.

The implementation of the glottal excitation epoch detector uses a total storage of 725 variables and coefficients: 253 for magnitude envelope calculation in Equation 8, 3 for dynamic range compression in Equation 9, 1 for compressed signal in Equations 10-11, 302 for Hilbert envelope in Equations 12-14, 47 for smoothed peak in Equations 15-16 and two-stage median mean smoothing, 5 for differentiation in Equation 17, 103 for amplitude thresholding, and 11 for duration thresholding. The technique involves an algorithmic delay of 21.4 ms, consisting of 12.5 ms for compression, 7.5 ms for Hilbert envelope, and 1.4 ms for epoch marking.

Figure 9:
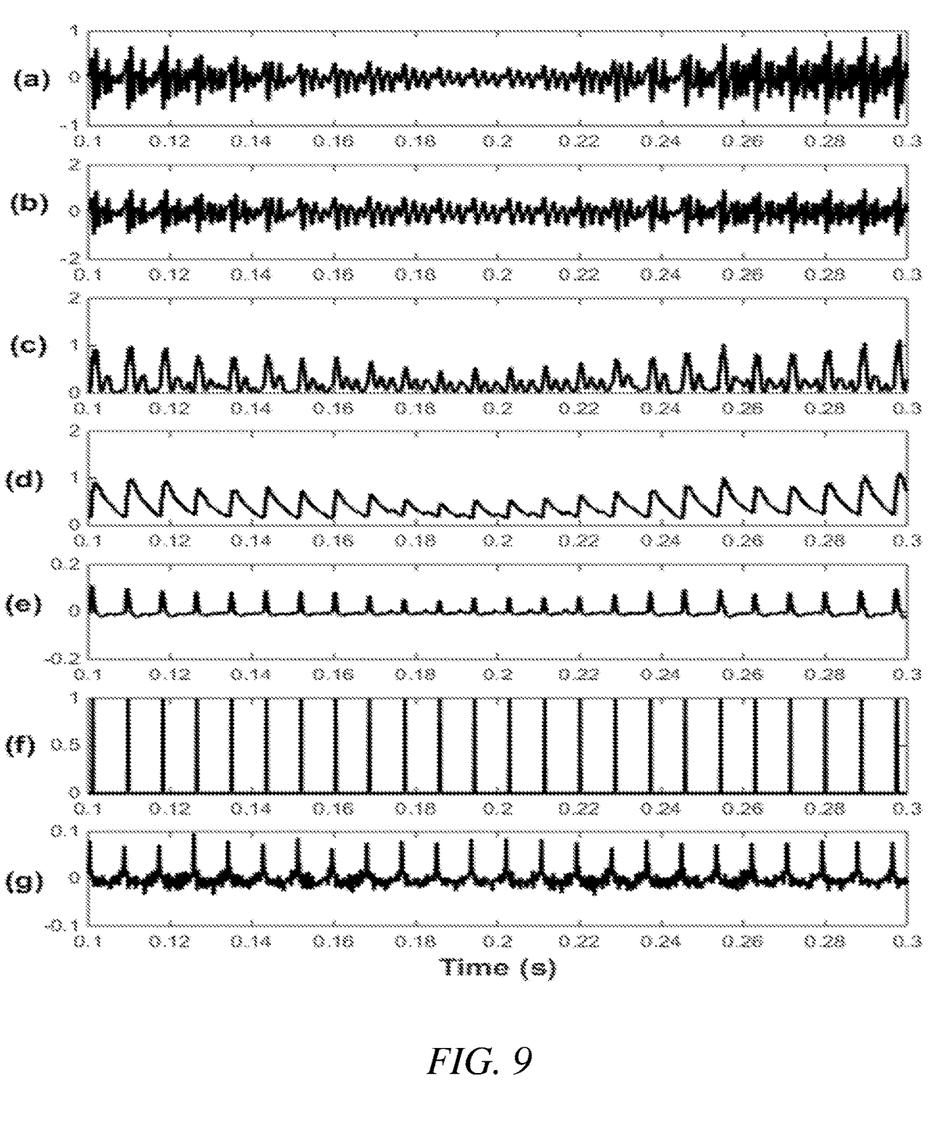
FIG. 9 illustrates an example of processing using the disclosed epoch detection technique.

FIG. 9 illustrates an example of processing using the disclosed epoch detection technique. Panel (a) shows the input speech waveform for the utterance /awa/ of a male speaker and panel (b) shows the dynamic range compressed signal. The Hilbert envelope, shown in panel (c), enhances the instants of glottal excitation. The peak envelope, shown in panel (d) reduces the ripples in the Hilbert envelope. The saliency-enhanced peak envelope, shown in panel (e) further enhances the glottal excitation epochs. The detected epochs are shown in panel (f). Panel (g) shows the differentiated electroglottogram (DEGG) signal acquired simultaneously with the speech signal and used as the reference for the detected epochs. The detected epochs are seen to be in accordance with the peaks of the glottal excitation as seen in the negative of the DEGG signal. A detailed performance evaluation of the technique, using test material from the CMU-ARCTIC database with simultaneously recorded speech and EGG signals from male and female speakers, showed that the disclosed technique compares favorably with the state-of-the-art techniques for clean speech and that the disclosed technique is robust against high-pass filtering.

The various modules disclosed in the above description can be implemented using digital signal processors, embedded microcontrollers, FPGAs (field programmable gate arrays), or ASICs (application specific integrated circuits) or a combination of such processors. Further, one, two, or more modules can be integrated into a single processor.

The above description along with the accompanying drawings is intended to disclose and describe the preferred embodiment of the invention in sufficient detail to enable those skilled in the art to practice the invention. It should not be interpreted as limiting the scope of the invention. Various changes in form and detail may be made without departing from its spirit and scope.

What is claimed is:

1. A method for real-time pitch tracking by detection of glottal excitation epochs in a speech signal, the method comprising the steps of:
   applying a dynamic range compression on the speech signal to obtain a dynamic range compressed signal;
   calculating a Hilbert envelope of the dynamic range compressed signal; and
   marking epochs and outputting pitch periods from the Hilbert envelope, wherein marking epochs and outputting pitch periods comprises:
      calculating a peak envelope and a smoothed peak envelope from the Hilbert envelope to retain saliency of the epochs and reduce residual ripples in the Hilbert envelope; and
      marking epochs and outputting pitch periods from the smoothed peak envelope by detection of a saliency, wherein the detection of the saliency comprises:
         obtaining a saliency-enhanced peak envelope by processing the smoothed peak envelope to emphasize the points with high rate of change; and
         applying amplitude-duration thresholding on the saliency-enhanced peak envelope, with an amplitude threshold and a duration threshold, to mark the epochs and output the pitch periods by:
            calculating the amplitude threshold as a short-time average magnitude of the saliency-enhanced peak envelope; and
            calculating the duration threshold as half of the mean of the preceding ten pitch periods which are lying within a set range of 2-15 ms, and applying a lower limit of 2 ms.

2. The method as claimed in claim 1, wherein applying the dynamic range compression comprises applying a feed-forward compression, wherein applying the feed-forward compression comprises:
   calculating a short-time average magnitude of the speech signal to obtain a magnitude envelope;
   calculating a compressed envelope from the magnitude envelope;
   calculating a gain from the magnitude envelope and the compressed envelope;
   delaying the speech signal by a delay to obtain a delayed speech signal, wherein the delay is equal to the delay introduced in obtaining the magnitude envelope; and
   obtaining the dynamic range compressed signal from the delayed speech signal and the gain.

3. The method as claimed in claim 1, wherein calculating the Hilbert envelope comprises:
   obtaining a Hilbert transformed signal of the dynamic range compressed signal;
   delaying the dynamic range compressed signal by a delay to obtain a delayed dynamic range compressed signal, wherein the delay is equal to the delay introduced in obtaining the Hilbert transformed signal;
   calculating the square of the Hilbert transformed signal to obtain a squared Hilbert transformed signal;
   calculating the square of the delayed dynamic range compressed signal to obtain a squared delayed dynamic range compressed signal; and
   adding the squared Hilbert transformed signal and the squared delayed dynamic range compressed signal to obtain the Hilbert envelope.

4. The method as claimed in claim 1, wherein calculating the peak envelope of the Hilbert envelope comprises updating a peak and a valley of the Hilbert envelope, using recursive relations with fast rise and slow fall rates.

5. The method as claimed in claim 1, wherein the nonlinear smoothing is carried out by applying a two-stage median-mean filtering on the peak envelope to obtain the smoothed peak envelope.

6. The method as claimed in claim 1, wherein applying the amplitude-duration thresholding to the saliency-enhanced peak envelope, with the amplitude threshold and the duration threshold comprises:
   marking a point as an epoch for the saliency-enhanced peak envelope that exceeds the amplitude threshold and the time interval since the last detected epoch exceeds the duration threshold; and
   outputting an impulse as epoch at each epoch marking and simultaneously outputting the inter-epoch interval as the pitch period.

7. The method as claimed in claim 1, wherein obtaining the saliency-enhanced peak envelope by processing the smoothed peak envelope comprises differentiating the smoothed peak envelope.

8. The method as claimed in claim 1, wherein obtaining the saliency-enhanced peak envelope by processing the smoothed peak envelope comprises applying a Teager energy operator on the smoothed peak envelope.

9. A system for real-time pitch tracking by detection of glottal excitation epochs in a speech signal, the system comprising:
   a dynamic range compression module configured to apply a dynamic range compression on the speech signal to obtain a dynamic range compressed signal;
   a Hilbert envelope calculation module configured to calculate a Hilbert envelope of the dynamic range compressed signal; and
   an epoch marking and pitch detection module to process the Hilbert envelope for marking epochs and outputting pitch periods, wherein the epoch marking and pitch detection module comprises:
      a dynamic peak detector module configured to obtain a peak envelope from the Hilbert envelope;
      a nonlinear smoother module configured to calculate a smoothed peak envelope from the peak envelope; and
      a saliency detector module configured to mark epochs and output pitch periods from the smoothed peak envelope by detection of a saliency,
      wherein the saliency detector module comprises:
         a saliency enhancer module configured to obtain a saliency-enhanced peak envelope by processing the smoothed peak envelope to emphasize the points with high rate of change;
         an amplitude-duration thresholding module configured to apply amplitude-duration thresholding on the saliency-enhanced peak envelope, with an amplitude threshold and a duration threshold, to mark the epochs and output the pitch periods;

an amplitude threshold calculator configured to calculate the amplitude threshold as a short-time average magnitude of the saliency-enhanced peak envelope; and a duration threshold calculator configured to calculate the duration threshold as half of the mean of the preceding ten pitch periods which are lying within a set range of 2-15 ms and apply a lower limit of 2 ms.

10. The system as claimed in claim 9, wherein the dynamic range compression module applies a feed-forward compression, wherein the dynamic range compression module comprises:

a magnitude envelope estimation module configured to calculate a short-time average magnitude of the speech signal to obtain a magnitude envelope;

a compressed envelope calculation module configured to calculate a compressed envelope from the magnitude envelope;

a gain calculator module configured to calculate a gain from the magnitude envelope and the compressed envelope;

a first delay module for delaying the speech signal by a delay to obtain a delayed speech signal, wherein the delay is equal to the delay introduced in obtaining the magnitude envelope; and a multiplier module for obtaining the dynamic range compressed signal from the delayed speech signal and the gain.

11. The system as claimed in claim 9, wherein the Hilbert envelope calculation module comprises:

a Hilbert transformer module configured to obtain a Hilbert transformed signal of the dynamic range compressed signal;

a second delay module for delaying the dynamic range compressed signal to obtain a delayed dynamic range compressed signal, wherein the delay introduced by the second delay module is equal to the delay introduced by the Hilbert transformer module;

a first squaring module for calculating the square of the Hilbert transformed signal to obtain a squared Hilbert transformed signal;

a second squaring module for calculating the square of the delayed dynamic range compressed signal to obtain a squared delayed dynamic range compressed signal; and an adder module for adding the squared Hilbert transformed signal and the squared delayed dynamic range compressed signal to obtain the Hilbert envelope.

12. The system as claimed in claim 9, wherein the dynamic peak detector module is configured to calculate the peak envelope of the Hilbert envelope, by updating a peak and a valley of the Hilbert envelope, using recursive relations with fast rise and slow fall rates.

13. The system as claimed in claim 9, wherein the nonlinear smoother module is configured to carry out nonlinear smoothing by applying a two-stage median-mean filtering on the peak envelope to obtain the smoothed peak envelope.

14. The system as claimed in claim 9, wherein the amplitude-duration thresholding module is configured to apply amplitude-duration thresholding on the saliency-enhanced peak envelope to obtain the epochs and the pitch periods, by marking a point as an epoch if the saliency-enhanced peak envelope exceeds the amplitude threshold and the time interval since the last detected epoch exceeds the duration threshold, and outputting an impulse as epoch at each epoch marking and simultaneously outputting the inter-epoch interval as the pitch period.

15. The system as claimed in claim 9, wherein the saliency enhancer module is configured to obtain the saliency-enhanced peak envelope by differentiating the smoothed peak envelope.

16. The system as claimed in claim 9, wherein the saliency enhancer module is configured to obtain the saliency-enhanced peak envelope by applying a Teager energy operator on the smoothed peak envelope.

* * * * *